(12) United States Patent
Ichikawa (10) Patent No.: US 7,851,903 B2
(45) Date of Patent: Dec. 14, 2010

(54) INFRARED DETECTOR WITH PLURALITY OF METALLIZATION BETWEEN FIRST AND SECOND CONTAINER MEMBERS

(75) Inventor: Kozo Ichikawa, Tokyo (JP)

(73) Assignee: Showa Optronics Co., Ltd., Tokyo (JP)

( * ) Notice: Subject to any disclaimer, the term of this patent is extended or adjusted under 35 U.S.C. 154(b) by 0 days.

(21) Appl. No.: 12/156,782

(22) Filed: Jun. 3, 2008

(65) Prior Publication Data

US 2008/0296719 A1    Dec. 4, 2008

(30) Foreign Application Priority Data

Jun. 4, 2007    (JP) ............................. 2007-147689

(51) Int. Cl.
*H01L 23/12*    (2006.01)
(52) U.S. Cl. ........................ 257/704; 257/732; 257/786
(58) Field of Classification Search ................. None
See application file for complete search history.

(56) References Cited

FOREIGN PATENT DOCUMENTS

| JP | 51-15973 | 2/1976 |
|---|---|---|
| JP | 2002-246492 | 8/2002 |
| JP | 2003-139616 | 5/2003 |

OTHER PUBLICATIONS

English Language Abstract, Publication No. JP2003139616; May 14, 2003, 1 p.
English Language Abstract, Publication No. JP 51-15973, Feb. 7, 1976; 2 pp.
English Language Abstract, Publication No. JP 2002-246492, Aug. 30, 2002, 1 p.

*Primary Examiner*—Alonzo Chambliss
(74) *Attorney, Agent, or Firm*—Haynes and Boone, LLP (57) ABSTRACT

An infrared detector comprises: first and second container members bonded to each other along an annular bonding portion to define a vacuum-sealed inner space, where the second container member has an infrared-transmissive property; an infrared detecting element disposed in the inner space; a first annular metallization layer formed on the bonding portion of the first container member; a second annular metallization layer formed on the bonding portion of the second container member; a solder metal for air-tightly bonding the first metallization layer and the second metallization layer; and a third metallization layer formed in a vicinity of one of the first and second metallization layers such that the third metallization layer overlaps the other of the first and second metallization layers at least partly.

7 Claims, 11 Drawing Sheets

PRIOR ART

INFRARED DETECTOR WITH PLURALITY OF METALLIZATION BETWEEN FIRST AND SECOND CONTAINER MEMBERS

CROSS-REFERENCE TO RELATED APPLICATION

This application claims priority under 35 U.S.C. §119 to Japanese Patent Application No. 2007-147689 filed Jun. 4, 2007 in the Japanese Patent Office, the contents of which is incorporated herein by reference in its entirety.

TECHNICAL FIELD

The present invention relates to an infrared detector having an infrared detecting element contained in a vacuum container and a manufacturing method thereof. Particularly, the present invention relates to a technique for sealably bonding two container members to each other by a solder metal in a vacuum atmosphere to form the vacuum container with an improved air-tightness at a sealing portion between the two container members.

BACKGROUND OF THE INVENTION

In general, an infrared detector is adapted to detect a temperature change of an infrared detecting element caused by infrared energy impinging upon the infrared detecting element. Thus, in order to prevent the impinging infrared energy from diffusing to surrounding areas, the infrared detector defines an inner space for containing the infrared detecting element therein and the inner space is maintained in vacuum. As a technique to achieve a high degree of vacuum of the inner space of the infrared detector in a short period of time, it is known to solder a ceramic container having an infrared detecting element mounted therein to a lid member in a vacuum chamber (see Japanese Patent Application Laid-Open Publication No. 2003-139616, for example). In this technique, the ceramic container and the lid member equipped with an infrared-transmissive window member are set in respective heater devices provided to upper and lower portions of a vacuum chamber, and then closely pressed against each other while being heated by the heater devices to melt a solder material arranged on the ceramic container. Thereafter, the heating is stopped to solidify the solder material and thereby achieve an air-tightly sealed infrared detector.

The '616 publication also discloses an infrared detector wherein in order to improve the bonding strength and air-tightness between the ceramic container and the lid member, the lid member is formed with a flange surface to ensure a sufficient bonding area with the ceramic container; the ceramic container, on which the solder material is arranged, is applied with a metallization for bonding; a portion of the lid member that is to contact the solder material is surface-treated to improve an affinity for the solder material (i.e., to improve the wettability by reducing the contact angle); and an edge of the flange is beveled so as to cause the solder material to form a fillet.

Figure 11:
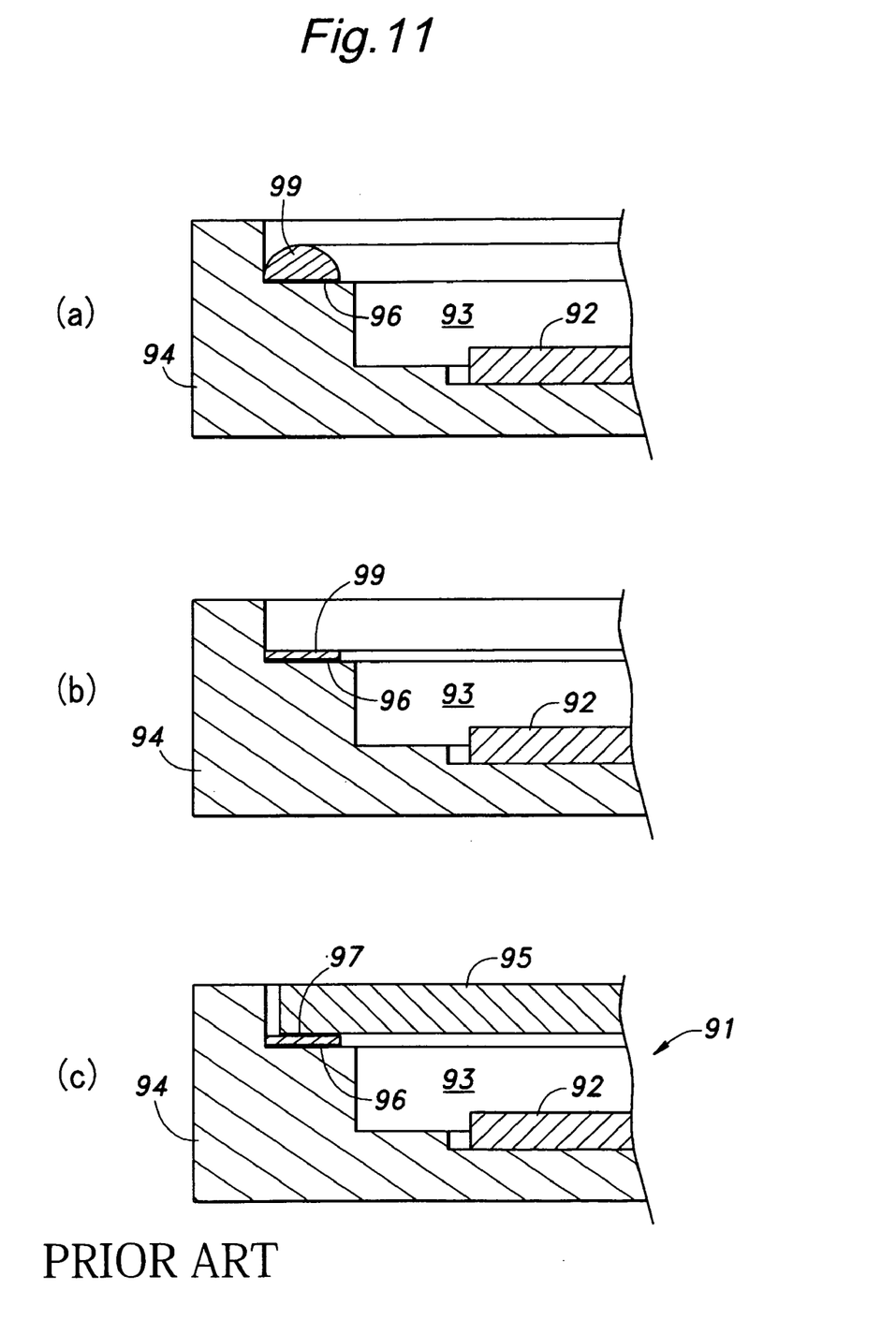
FIGS. 11(a)-(c) are partial cross-sectional views for showing a manufacturing process of an infrared detector according to a conventional embodiment.

Such a conventional infrared detector can be manufactured as follows: As shown in FIG. 11(a), a container-side metallization layer 96 is first formed on an upper surface of a ceramic container 94 which includes an infrared detecting element 92 contained in a cavity 93, and then, in a vacuum atmosphere, a pre-molten solder metal 99 having a melting temperature of 250° C. or lower, such as In-Sn or Sn-Ag alloys, is deposited on the container-side metallization layer 96. In this state, because the solder metal 99 has a low affinity for the ceramic container 94 (i.e., the contact angle is large and the wettability is poor) and a high affinity for the container-side metallization layer 96 (i.e., the contact angle is small and the wettability is good), the solder metal 99 stays only on the container-side metallization layer 96 due to the tension surface. Then, the ceramic container 94 is returned to an atmospheric condition, and as shown in FIG. 11(b), an unnecessary portion of the solder metal 99 as well as an oxide film formed on a surface of the solder metal 99 are cut or scraped off by means of a lathe or the like. Subsequently, the ceramic container 94 and an infrared-transmissive window member 95 formed with a window-side metallization layer 97 on its undersurface are placed at predetermined positions within a vacuum chamber and undergo a baking process for gas removal. Then, as shown in FIG. 11(c), the infrared-transmissive window member 95 is moved onto the ceramic container 94 and pressed against the ceramic container 94 in a vacuum atmosphere while being heated, and this causes the solder metal 99 and the window-side metallization 97 to be fusion-bonded to each other. Then, the temperature is lowered in the vacuum condition to solidify the solder metal 99 to seal the joint between the ceramic container 94 and the infrared-transmissive window member 95. This completes an infrared detector 1.

However, in the conventional method for manufacturing the infrared detector, the scrapped-off material may be wastefully discarded. Further, because it takes a long period of time for the baking process to complete, the metal surface exposed by scraping off the oxide film cannot be maintained clean before the sealing process. Specifically, segregation, contamination and/or dross (solder scum such as an oxide film) can appear on the solder metal surface and deteriorate the air-tightness of the solder metal. In order to improve the air-tightness, it may be conceived to oscillate the infrared-transmissive window member during the melted state of the solder metal to scrub the surface of the solder metal and thereby expose a clean surface of the solder metal anew, but this cannot completely eliminate the leakage and may still result in inferior products. Also, the above manufacturing process of the infrared detector requires a number of steps, and this can lead to a higher manufacturing cost.

BRIEF SUMMARY OF THE INVENTION

The present invention has been made to solve the above prior art problems, and a primary object of the present invention is to provide an infrared detector that is simple in structure and can be manufactured by a simple manufacturing process but can reliably achieve air-tightness, while being able to reduce the number of manufacturing steps and decrease the amount of wasted material as well as the number of inferior products, to thereby lower the manufacturing cost. Another object of the present invention is to provide a method for manufacturing such an infrared detector.

In order to achieve the above objects, the present invention provides an infrared detector, comprising: first and second container members bonded to each other along an annular bonding portion to define a vacuum-sealed inner space, the second container member having an infrared-transmissive property; an infrared detecting element disposed in the inner space; a first annular metallization layer formed on the bonding portion of the first container member; a second annular metallization layer formed on the bonding portion of the second container member; a solder metal for air-tightly bonding the first metallization layer and the second metallization layer; and a third metallization layer formed in a vicinity of one of the first and second metallization layers such that the third metallization layer overlaps the other of the first and second metallization layers at least partly.

In such a structure, the third metallization layer formed in a vicinity of the first metallization layer or the second metallization layer can be used to preliminarily arrange the solder metal thereon so that when the first container member and the second container member are pressed against each other while being heated in the vacuum atmosphere, the oxide film formed on the surface of the preliminarily arranged solder metal is broken and a clean (or pure) portion of the melted solder metal can flow out through the broken oxide film and move to enter between the first metallization layer and the second metallization layer. The melted solder metal can spread over the surfaces of these metallization layers owing to capillary effect, and when cooled, bonds the first and second metallization layers. The solder metal that bonds the first and second metallization layers contains substantially no impurities and thus can provide a highly reliable air-tight seal, which contributes to a less number of inferior products. Also, in the present invention, it is unnecessary to cut or scrape off the oxide film or an unnecessary portion of the preliminarily arranged solder metal nor scrub the scraped-off surface of the solder metal, and thus the manufacturing process can be simplified and an amount of wastefully discarded material can be reduced. Further, because the solder metal preliminary arrangement step can be conducted in an atmospheric condition, there is no need to conduct a step for preparing a vacuum atmosphere (such as a baking step) before the solder metal preliminary arrangement step. This also contributes to simplifying the manufacturing process.

Preferably, the infrared detector may comprise a plurality of the third metallization layers. In this way, the solder metal can spread over an entire periphery of the annular first and second metallization layers more easily and in a shorter period of time compared with the case where only a single third metallization layer is formed. Further, the amount of solder metal preliminarily arranged on the third metallization layers can be reduced, and this can reduce the time required for melting the solder metal and lower the heating temperature whereby a damage to the infrared detecting element can be avoided.

Also preferably, the third metallization layer and the one of the first and second metallization layers are formed on parallel surfaces having different heights. This can effectively prevent the solder metal from inadvertently deposited onto the one of the first and second metallization layers in the solder metal preliminary arrangement step for preliminarily arranging the solder metal on the third metallization layer. This makes it unnecessary to provide a lateral space or gap between the third metallization layer and the one of the first and second metallization layers, which can contribute to achieving a more compact infrared detector.

According to another aspect of the present invention, there is provided a manufacturing method of an infrared detector, wherein the infrared detector comprises: first and second container members bonded to each other along an annular bonding portion to define a vacuum-sealed inner space, the second container member having an infrared-transmissive property; and an infrared detecting element disposed in the inner space, the method comprising the steps of: forming a first annular metallization layer on the bonding portion of the first container member; forming a second annular metallization layer on the bonding portion of the second container member; forming a third metallization layer in a vicinity of one of the first and second metallization layers such that the third metallization layer overlaps the other of the first and second metallization layers at least partly; arranging a melted solder metal on the third metallization layer; pressing the first container member and the second container member against each other while heating in a vacuum atmosphere to cause the solder metal to move to the one of the first and second metallization layers; and cooling the solder metal in the vacuum atmosphere to air-tightly bond the first and second container members.

In such a manufacturing method also, similar advantages as described above can be obtained.

Other objects, features and advantages of the present invention will become more fully apparent from the following description with reference to the appended drawings.

BRIEF DESCRIPTION OF THE DRAWINGS

Now the present invention is described in the following with reference to the appended drawings, in which.

DETAILED DESCRIPTION OF THE PREFERRED EMBODIMENTS

Structure of Infrared Detector According to Preferred Embodiment

Figure 1:
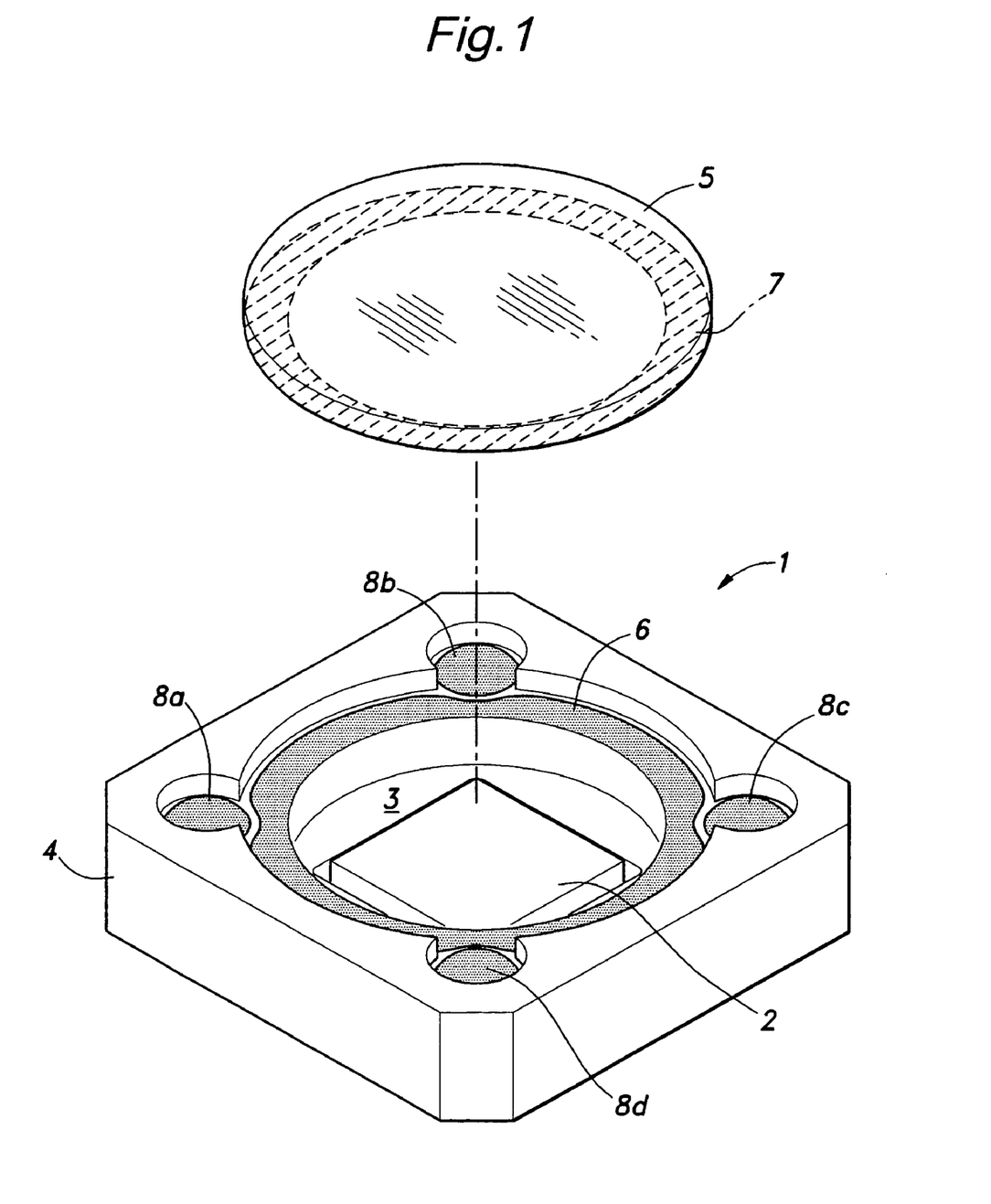
FIG. 1 is a perspective view of an infrared detector according to a preferred embodiment of the present invention before being sealed.
Figure 2:
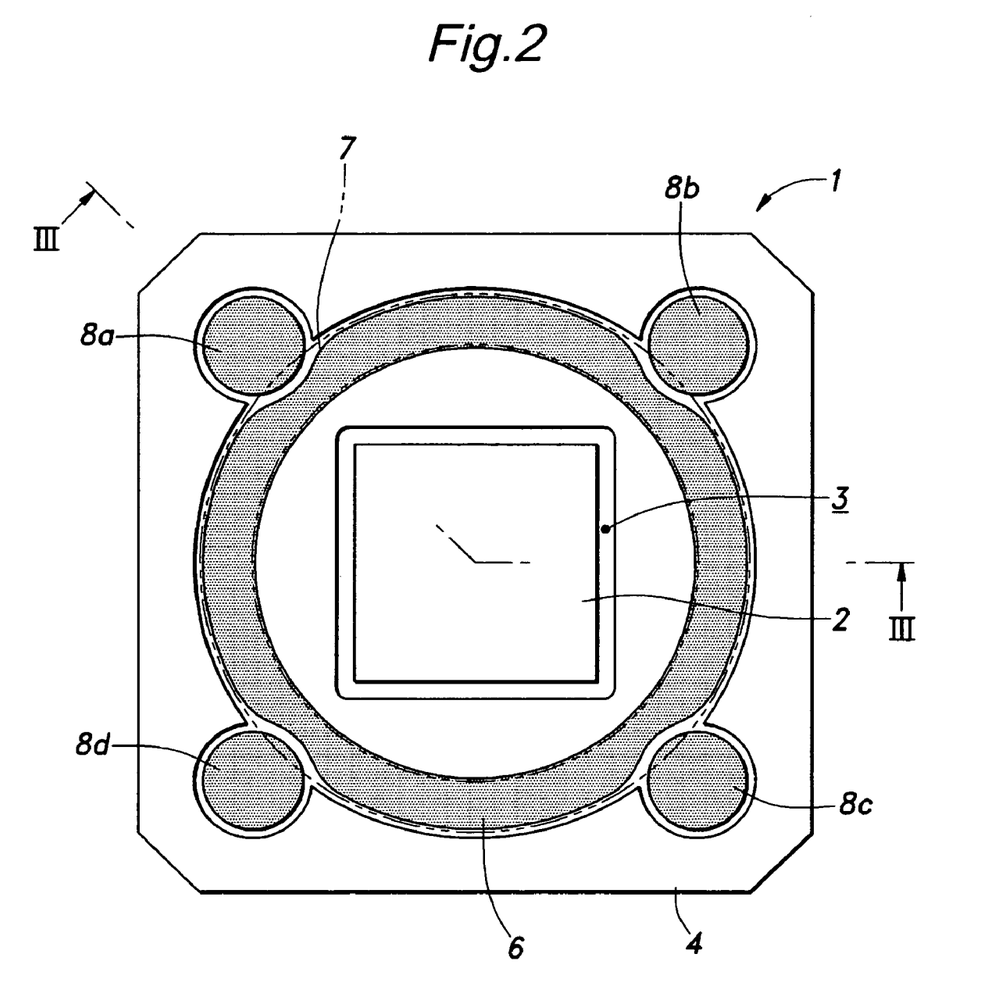
FIG. 2 is a plan view of a ceramic container for constituting the infrared detector according to the preferred embodiment.
Figure 3:
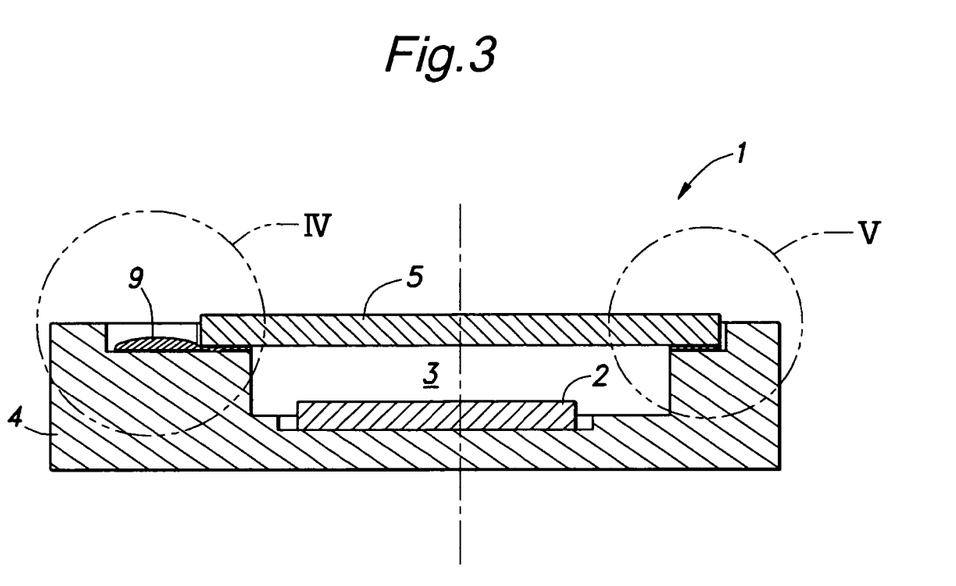
FIG. 3 is a cross-sectional view of the infrared detector taken along the line III-III in FIG. 2.
Figure 4:
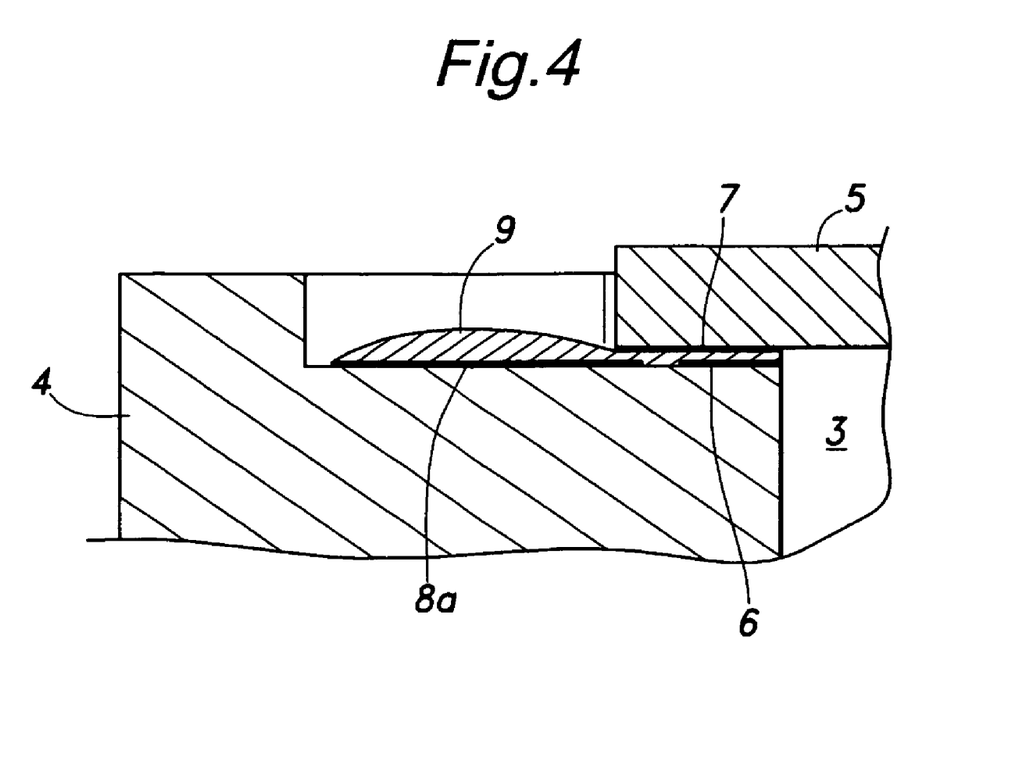
FIG. 4 is an enlarged view of a portion IV in FIG. 3.
Figure 5:
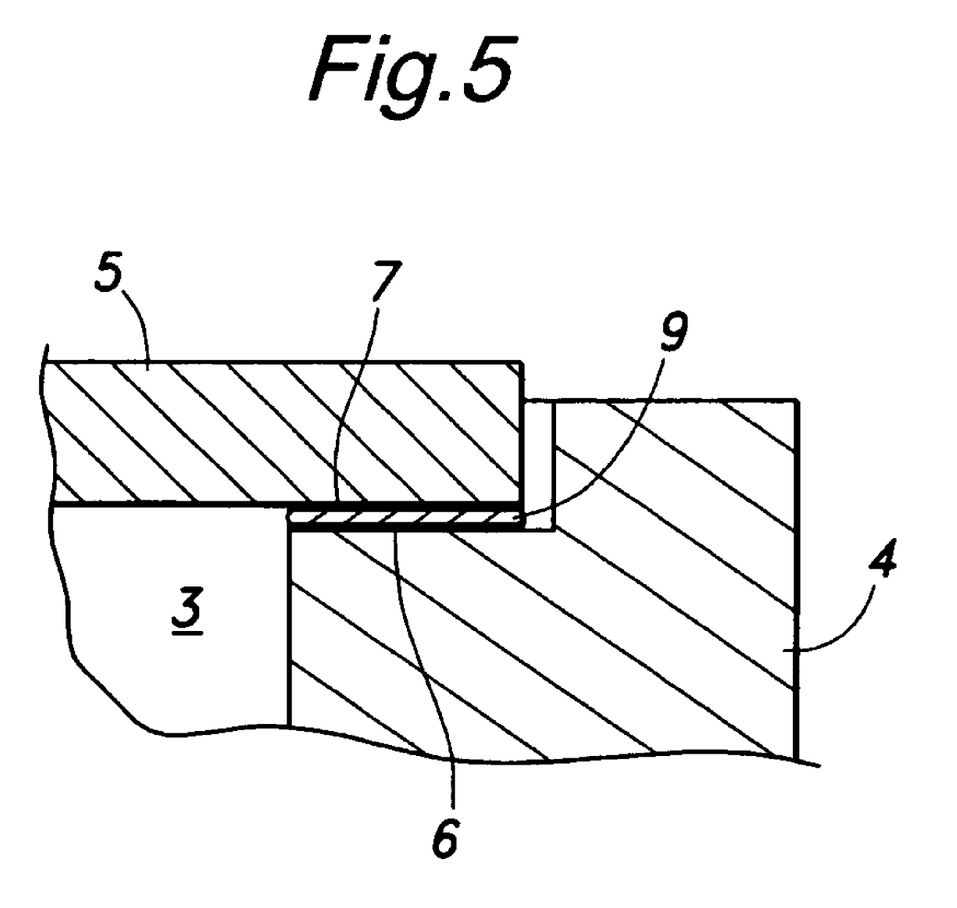
FIG. 5 is an enlarged view of a portion V in FIG. 3.

FIG. 1 is a perspective view of an infrared detector 1 according to a preferred embodiment of the present invention before being sealed, FIG. 2 is a plan view of a ceramic container 4 for constituting the infrared detector 1, FIG. 3 is a cross-sectional view taken along the line III-III in FIG. 2 and shows the infrared detector 1 after being sealed, FIG. 4 is an enlarged view of a portion IV in FIG. 3, and FIG. 5 is an enlarged view of a portion V in FIG. 3. As shown in FIGS. 1-5, the infrared detector 1 comprises an infrared detecting element 2, a rectangular ceramic container 4 (first container member) defining a substantially cylindrical cavity 3 (inner space) for accommodating the infrared detecting element 2 therein, and an infrared-transmissive window member 5 (second container member) having a circular plate shape for air-tightly closing the cavity 3 of the ceramic container 4.

The infrared-transmissive window member 5 is made of a material having an infrared-transmissive property, such as germanium, silicon, sapphire, etc. The infrared detecting element 2 detects a temperature change caused by the infrared that has passed the infrared-transmissive window member 5. Though not shown in the drawings, the infrared detecting element 2 is electrically connected to a plurality of bonding pads formed in the ceramic container 4 via a plurality of wires. In order to prevent the infrared energy that has passed the window member 5 from diffusing to surrounding areas, the inner space (cavity 3) defined by the ceramic container 4 and the infrared-transmissive window member 5 is air-tightly sealed to maintain a vacuum condition.

The air-tight bond between the ceramic container 4 and the infrared-transmissive window member 5 is achieved by an annularly arranged solder metal 9. The solder metal 9 may consist of a low-melting metal having a melting point not exceeding 250° C., such as In—Sn alloys or Sn—Ag alloys.

As shown in FIGS. 1 and 2, on a flat bonding portion of the ceramic container 4 to which the infrared-transmissive window member 5 is bonded (i.e., on an annular shoulder surface defined at an opening of the cavity 3), a container-side metallization layer 6 (first metallization layer) is formed in an annular shape. Further, in an outer vicinity of the container-side metallization layer 6 and on the same plane as the shoulder surface defined at the opening of the cavity 3, four supplementary metallization layers 8a-8d (third metallization layer) are formed at locations corresponding to four corners of the ceramic container 4. The supplementary metallization layers 8a-8d are used for preliminarily placing the solder metal 9 thereon, as described in detail later. Four portions of an outer edge (or boundary) of the container-side metallization layer 6 near the supplementary metallization layers 8a-8d recede inwardly, and the supplementary metallization layers 8a-8d partially protrude into the recessed portions. In other words, the supplementary metallization layers 8a-8d are arranged so as to partially overlap a circle circumscribed to the container-side metallization layer 6.

On the other hand, as shown in FIG. 1, on a bonding portion of the infrared-transmissive window member 5 that is bonded to the ceramic container 4, an annular window-side metallization layer 7 (second metallization layer) is formed along a circular outer profile of the window member 5. As shown by broken lines in FIG. 2, the window-side metallization layer 7 has an inner diameter substantially the same as that of the container-side metallization layer 6, and an outer diameter substantially the same as a diameter of the circle circumscribed to the container-side metallization layer 6. Therefore, when the infrared-transmissive window member 5 is bonded to the ceramic container 4, the window-side metallization layer 7 partially overlaps each of the supplementary metallization layers 8a-8d when seen in the plan view.

In a case that the container 4 is made of a ceramic, the metallization layers 6, 7, 8a-8d can be preferably constituted by an electroconductive pattern made of sintered Mo, Mn, Ti or the like covered by an electroplating layer made of a material such as Ni, Ag, Au which has a high affinity for the solder metal 9. If the container is made of germanium, silicon, sapphire or glass, the metallization layers 6, 7, 8a-8d can be preferably made of stacked evaporation films made of Cr, Cu, Ni, Ag, or Au, for example. The thickness of metallization layers 6, 7, 8a-8d can be several tens μm-100 μm. Further, the container-side metallization layer 6 preferably has a width greater than 0.2 mm and smaller than 10 mm, and in the present embodiment, the container-side metallization layer 6 has a width of 1.5 mm at its minimum width portion. A space between the container-side metallization layer 6 and each of the supplementary metallization layers 8a-8d should be 0.1 mm or more in order to prevent the melted solder metal 9 from inadvertently moving from the supplementary metallization layers 8a-8d to the container-side metallization layer 6, and in the present embodiment, the space is set at 0.5 mm.

As shown in FIGS. 4 and 5, the solder metal 9 is fusion-bonded to an entire surface of the container-side metallization layer 6, window-side metallization layer 7 and supplementary metallization layers 8a-8d, and preferably has a thickness from several tens to several hundreds μm at a portion interposed between the container-side metallization layer 6 and the window-side metallization layer 7. A portion of the solder metal 9 that has not been used in bonding the container-side metallization layer 6 and the window-side metallization layer 7 remains on parts of the supplementary metallization layers 8a-8d that do not overlap the window-side metallization layer 7.

Figure 6:
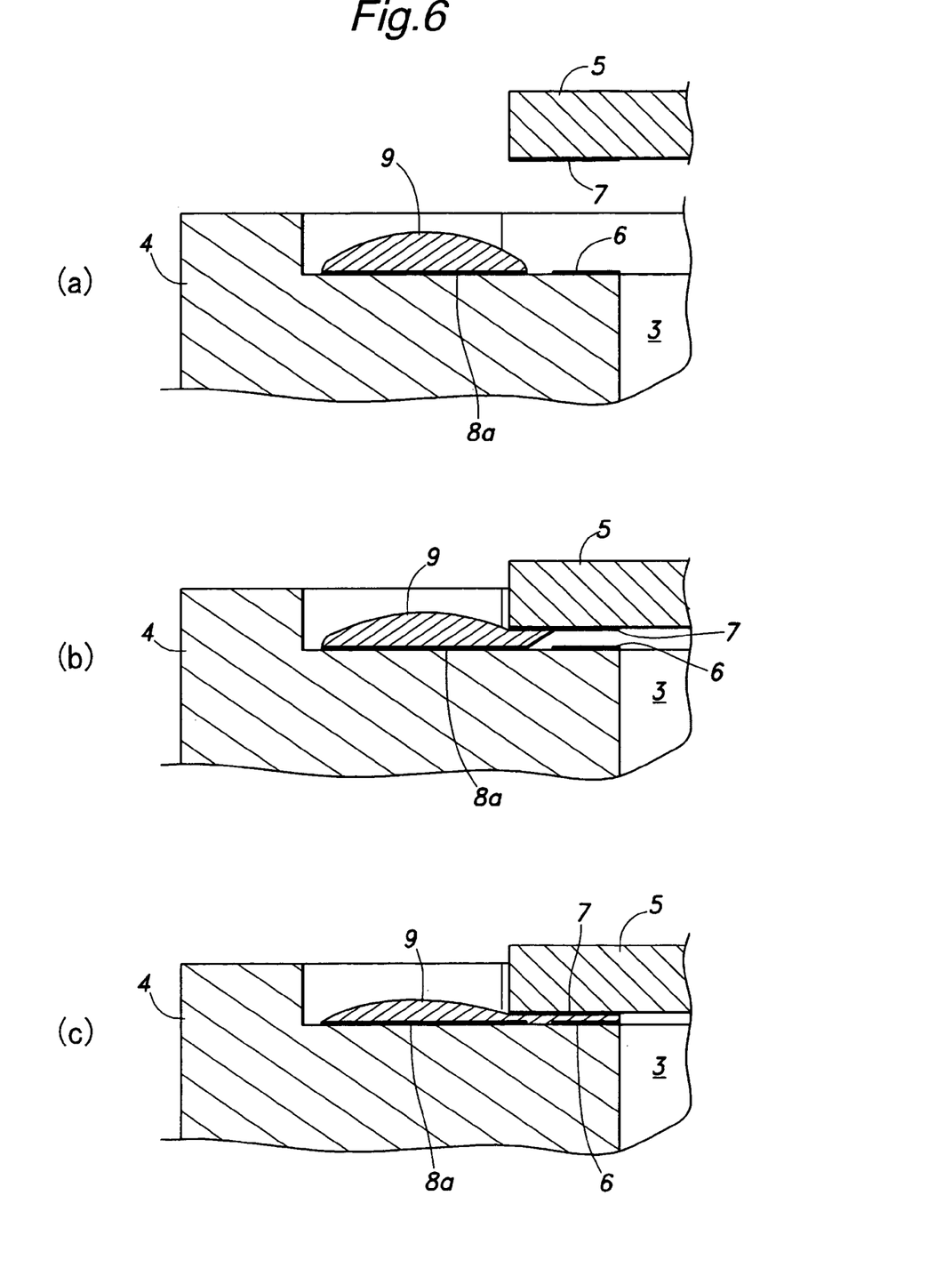
FIGS. 6(a)-(c) are partial cross-sectional views for showing a manufacturing process of the infrared detector according to the preferred embodiment.

Manufacturing Process of the Infrared Detector
According to Preferred Embodiment Next, with reference to FIGS. 6(*a*)-(*c*), an explanation is made to a manufacturing process of the infrared detector 1 according to the above embodiment. FIG. 6(*a*) is a partial cross-sectional view of the infrared detector 1 in a step for preliminary arrangement of solder metal, FIG. 6(*b*) is a partial cross-sectional view of the infrared detector 1 in a step for solder metal traveling, and FIG. 6(*c*) is a partial cross-sectional view of the infrared detector 1 in a step for container sealing.

In the manufacturing process of the infrared detector 1, first, the annular container-side metallization layer 6 is formed on a bonding portion of the ceramic container 4 to which the infrared-transmissive window member 5 is to be bonded (first metallization layer forming step). In parallel with this step, the four supplementary metallization layers 8a-8d are formed on the ceramic container 4 in the vicinity of the container-side metallization layer 6 (third metallization layer forming step). In this step, the supplementary metallization layers 8a-8d are arranged such that each of the metallization layers 8a-8d partially overlaps the later described window-side metallization layer 7. Further, in parallel with the above steps, the annular window-side metallization layer 7 is formed on a bonding portion of the infrared-transmissive window member 5 that is to be bonded to the ceramic container 4 (second metallization layer forming step). The container-side metallization layer 6 and the window-side metallization layer 7 are used for sealingly bonding the ceramic container 4 and the infrared-transmissive window member 5 by the solder metal 9, and the supplementary metallization layers 8a-8d are used for preliminarily arranging the melted solder metal 9 thereon before bonding the ceramic container 4 to the infrared-transmissive window member 5.

Next, as shown in FIG. 6(*a*), melted solder metal 9 is deposited onto the four supplementary metallization layers 8a-8d formed in the four corners of the ceramic container 4 (solder metal preliminary arrangement step). Because the solder metal 9 has a high affinity for the supplementary metallization layers 8a-8d and a low affinity for ceramic, the melted solder metal 9 resides only on the supplementary metallization layers 8a-8d in an upwardly protruding, substantially semispherical shape. Thus, the supplementary metallization layers 8a-8d function to retain the solder metal 9 within a predetermined area. It should be noted that in the present embodiment, the manufacturing process starts from a state where the infrared detecting element 2 has been already disposed in the ceramic container 4, but the disposition of the infrared detecting element 2 and its electric connection by means of wire bonding may be conducted after the first metallization layer forming step or the solder metal preliminary arrangement step.

Subsequently, the ceramic container 4 and the infrared-transmissive window member 5 are placed at predetermined positions in a vacuum chamber (not shown in the drawings), and a baking process is conducted to create a required vacuum atmosphere in the vacuum chamber. The infrared-transmissive window member 5 is centered with respect to the ceramic container 4 by means of a jig and moved onto the ceramic container 4 by means of a manipulator. Then, the infrared-transmissive window member 5 and the ceramic container 4 are pressed against each other while being heated in the vacuum atmosphere.

As a result, as shown in FIG. 6(b), the solder metal 9 is melted and a part the oxide film on the surface of the pressed portion of the solder metal 9 is broken to expose a clean or pure surface of the solder metal 9. Because the dross has poor fluidity, it stays where it is and only the clean solder metal 9 flows out. The clean solder metal 9 moves along the window-side metallization layer 7, which has a high affinity for the solder metal 9, toward an inner side of the container 4 (in the right direction of the drawing) and reaches the container-side metallization layer 6 (solder metal traveling step). Thus, the window-side metallization layer 7 serves to guide the solder metal 9 to move to the container-side metallization layer 6 or connect the supplementary metallization layers 8a-8d to the container-side metallization layer 6 by means of the solder metal 9.

Then, as shown in FIG. 6(c), when a gap or distance between the container-side metallization layer 6 and the window-side metallization layer 7 is reduced below a prescribed value, capillary effect causes the solder metal 9 to spread over an entire surfaces of the container-side metallization layer 6 and the window-side metallization layer 7. With this state being maintained, the solder metal 9 is cooled in the vacuum atmosphere, whereby the ceramic container 4 and the infrared-transmissive window member 5 are bonded to each other air-tightly (container sealing step). In this way, the above manufacturing steps provide the infrared detector 1 having the infrared detecting element 2 contained in the cavity 3 air-tightly defined by the ceramic container 4 and the infrared-transmissive window member 5.

Effects of Preferred Embodiment

As described above, in the above embodiment, the supplementary metallization layers 8a-8d are formed in the vicinity of the container-side metallization layer 6 on the ceramic container 4 in such a manner that the supplementary metallization layers 8a-8d each partly overlap the window-side metallization layer 7, and the supplementary metallization layers 8a-8d are used to preliminarily arrange the solder metal 9 thereon. In such a structure, it is not necessary to conduct the preliminary arrangement of the solder metal 9 in the vacuum atmosphere because even though impurities may exit between the preliminarily arranged solder metal 9 and the supplementary metallization layers 8a-8d and an oxide film may be formed on the surface of the solder metal 9, in the subsequent solder metal traveling step a clean portion of the solder metal 9 can flow out through the broken oxide film to enter between the container-side metallization layer 6 and the window-side metallization layer 7 (or between the annular bonding portions of the ceramic container 4 and the window member 5) and bond them in an air-tight fashion. Further, because the clean portion of the solder metal 9 can be caused to spread over an entire part of the annular bonding portions of the container 4 and the window member 5 by pressing the container 4 and the window member 5 against each other while heating in the vacuum atmosphere, it is unnecessary to cut or scrape off the oxide film or unnecessary portion of the solder metal 9 and scrub the scraped-off surface of the solder metal 9 as in the prior art. The container-side metallization layer 6 and the window-side metallization layer 7 used for sealing are bonded together by the clean portion of the solder metal 9 that substantially does not contain impurities, and this can ensure air-tightness at the sealing portion.

Because the supplementary metallization layers 8a-8d are arranged in corners of the rectangular ceramic container 4 outside of the container-side metallization layer 6, the supplementary metallization layers 8a-8d do not increase the length of each side of the ceramic container 4 and therefore, a compact infrared detector 1 can be achieved. Further, the arrangement of four supplementary metallization layers 8a-8d in the respective four corners of the ceramic container 4 can reduce the distance of the travel of the solder metal 9 caused by capillary effect compared with the case where a single supplementary metallization layer is formed only in one corner, and this contributes to reducing the travel time of the solder metal 9.

As described above, in the present invention, the step of scraping off the oxide film and unnecessary portion of the solder metal 9 is unnecessary, and therefore, the solder metal preliminary arrangement step can be conducted in parallel with the baking process for gas removal from the vacuum chamber, and this could reduce the manufacturing time even further. Moreover, the present invention can achieve a higher yield owing to the more reliable air-tightness at the sealing portion and this, in cooperation with the simplified manufacturing process, can lead to a considerable reduction in the manufacturing cost.

First Modified Embodiment

Figure 7:
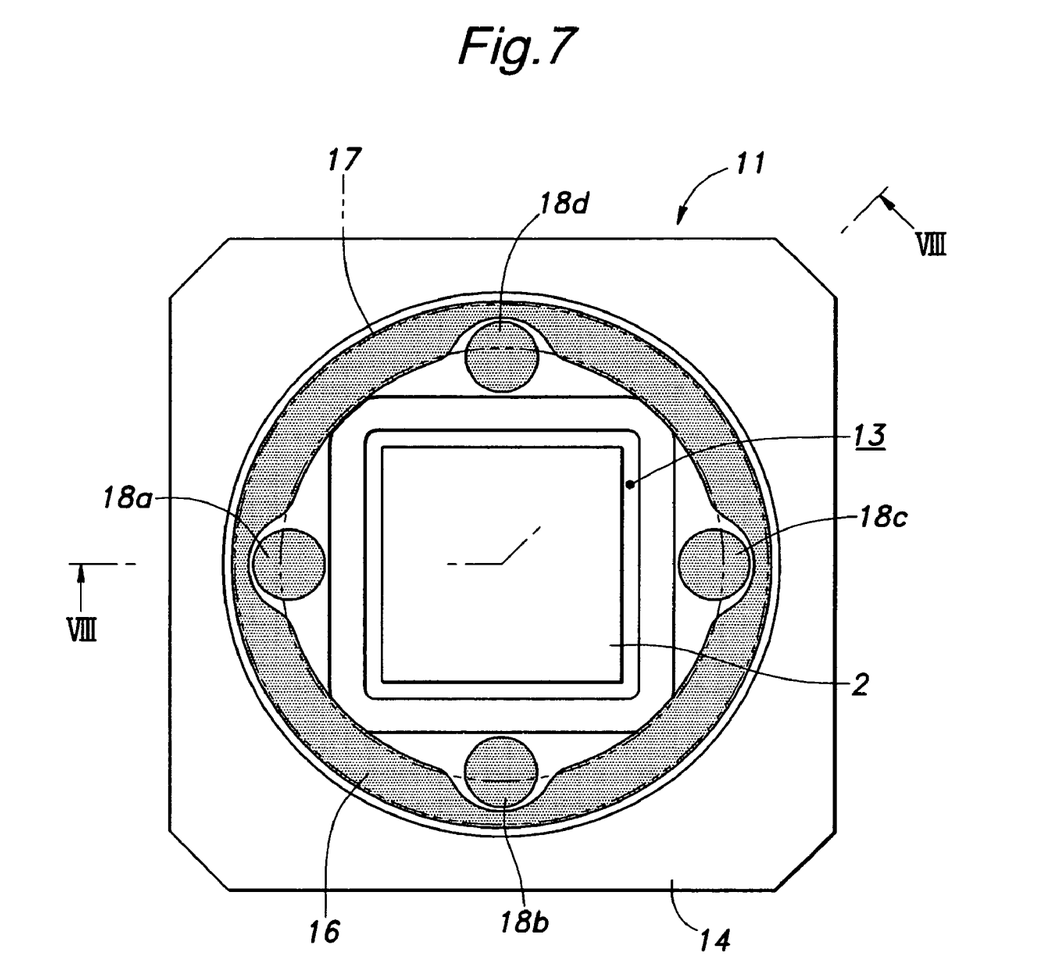
FIG. 7 is a plan view of a ceramic container for constituting an infrared detector according to a first modified embodiment.
Figure 8:
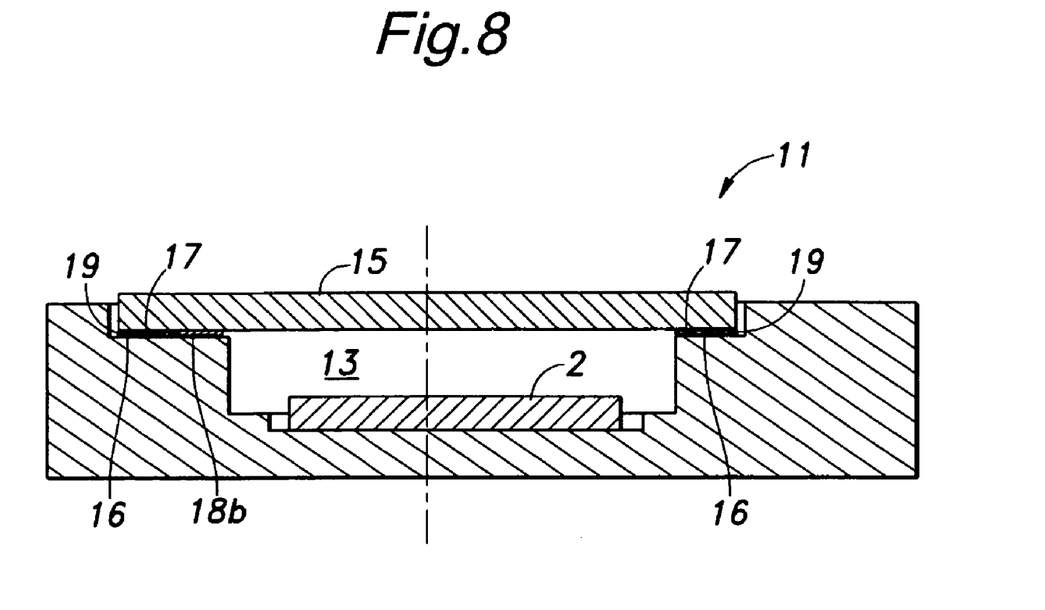
FIG. 8 is a cross-sectional view taken along the line VIII-VIII in FIG. 7.

With reference to FIGS. 7 and 8, an explanation is made to the structure and manufacturing process of an infrared detector 11 according to a first modified embodiment of the invention. FIG. 7 is a plan view of a ceramic container 14 of the infrared detector 11, and FIG. 8 is a cross-sectional view taken along the line VIII-VIII in FIG. 7 showing the infrared detector 11 after sealing. In the explanation below, a description that would overlap the description of the above embodiment will be omitted, and an explanation will be mainly made to the structures and effects that are different from those of the above embodiment.

This modified embodiment is characterized by four circular supplementary metallization layers 18a-18d arranged inside of an annular container-side metallization layer 16. The ceramic container 14 is formed with a cavity 13 having a substantially square cross-section, and the annular container-side metallization layer 16 is formed on a shoulder surface defined at an opening of the cavity 13 so as to surround the opening of the cavity 13. The four supplementary metallization layers 18a-18d are formed in an inner vicinity of the container-side metallization layer 16, each being aligned with an intermediate point of the corresponding sides of the opening of the cavity 13. Four portions of an inner boundary of the container-side metallization layer 16 close to the supplementary metallization layers 18a-18d recede in a radially outward direction, and part of the supplementary metallization layers 18a-18d are placed in these receding portions. In other words, the supplementary metallization layers 18a-18d partially overlap with a circle inscribed to the container-side metallization layer 16.

As shown by broken lines in FIG. 7, a window-side metallization layer 17 has an inner diameter substantially the same as a diameter of the circle inscribed to the container-side metallization layer 16, and an outer diameter substantially the same as the outer diameter of the container-side metallization layer 16. Therefore, when an infrared-transmissive window member 15 is bonded to the ceramic container 14, the window-side metallization layer 17 partially overlaps each of the supplementary metallization layers 18a-18d.

In a manufacturing process of the infrared detector 11 according to this modified embodiment, a solder metal 19 is placed on the supplementary metallization layers 18a-18d formed inside of the container-side metallization layer 16 in the solder metal preliminary arrangement step, and the solder metal 19 is melted such that the solder metal 19 moves toward an inner side of the container 14 along the window-side metallization layer 17, which has a high affinity for the solder metal 19, to reach the container-side metallization layer 16 in the solder metal traveling step.

By arranging the supplementary metallization layers 18a-18d inside of the container-side metallization layer 16, it is possible to ensure a space for forming the supplementary metallization layers 18a-18d not only for the ceramic container 14 having a rectangular shape but also for those having any other desired shape such as a circular shape when seen in the plan view.

Second Modified Embodiment

Figure 9:
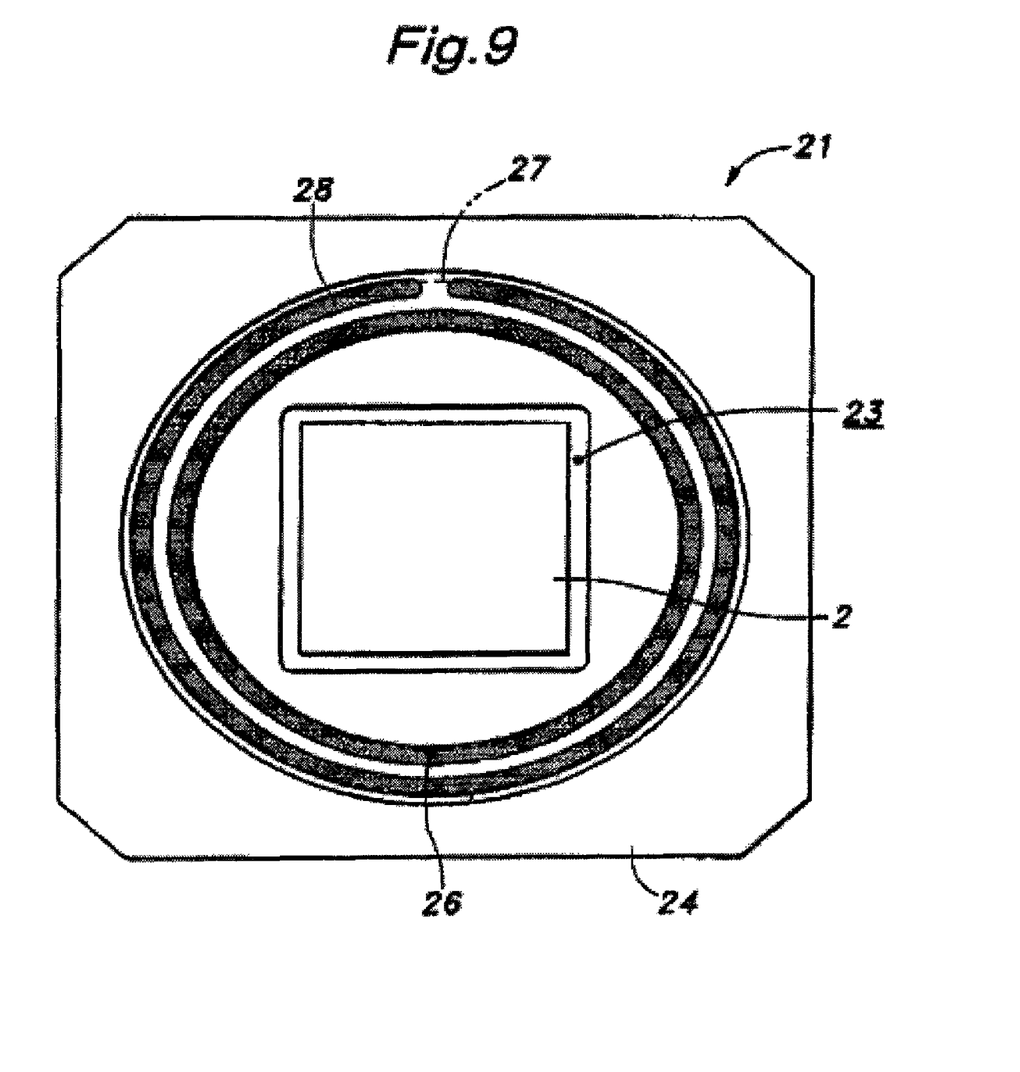
FIG. 9 is a plan view of a ceramic container for constituting an infrared detector according to a second modified embodiment.

Next, with reference to FIG. 9, an explanation is made to the structure of an infrared detector 21 according to a second modified embodiment of the invention. FIG. 9 is a plan view of a ceramic container 24 of the infrared detector which includes an infrared detecting element 2 contained in a cavity 23. In this modified embodiment, a ribbon-shaped supplementary metallization layer 28 is formed outside of an annular container-side metallization layer 26 so as to extend along the container-side metallization layer 26. The supplementary metallization layer 28 is outwardly spaced apart a predetermined distance from the container-side metallization layer 26 and has a constant width. The ends of the supplementary metallization layer 28 are spaced apart from each other, and thus the supplementary metallization layer 28 does not assume a complete annular shape.

On the other hand, a window-side metallization layer 27 shown by broken lines has a substantially same inner diameter as the container-side metallization layer 26. As in the above embodiments, the window-side metallization layer 27 is for guiding the solder metal 9 preliminarily placed on the supplementary metallization layer 28 to move to the container-side metallization layer 26, and for being bonded to the container-side metallization layer 26 to seal the infrared detector 21. Thus, the window-side metallization layer 27 may have any desired outer diameter so long as the window-side metallization layer 27 can at least partially overlap the supplementary metallization layer 28. In this embodiment, the window-side metallization layer 27 has an outer diameter substantially the same as a diameter of a circle circumscribed to the supplementary metallization layer 28.

By arranging the supplementary metallization layer 28 so as to surround the container-side metallization layer 26, the travel distance of the solder metal (not shown in the drawing) that moves to the container-side metallization layer 26 can be reduced, and thus the solder metal traveling step for the infrared detector 21 can be completed with a shorter period of time. Further, because the ribbon-shaped supplementary metallization layer 28 is formed in an non-annular shape with its ends being spaced apart a small distance from each other, the solder metal preliminarily arranged on the supplementary metallization layer 28 in the solder metal preliminary arrangement step can easily have a constant height, and therefore, the travel of the solder metal can be carried out evenly throughout a length of the solder metal. This can contribute to improvement of the product quality and reduction in the manufacturing time.

Figure 10:
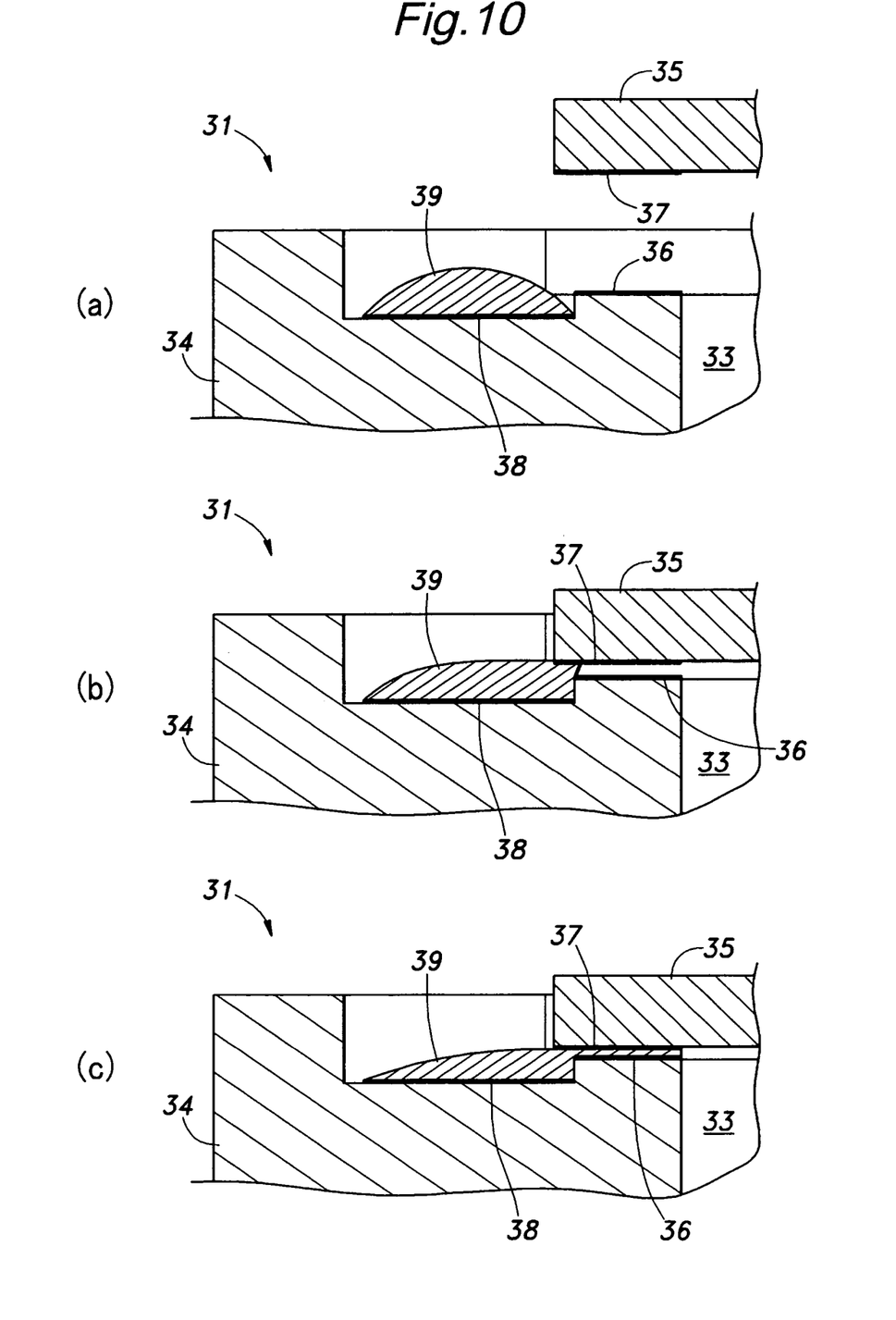
FIGS. 10(a)-(c) are partial cross-sectional views for showing a manufacturing process of an infrared detector according to a third modified embodiment.

Next, with reference to FIG. 10, an explanation is made to the structure of an infrared detector 31 according to a third modified embodiment. FIGS. 10(a)-(c) are partial cross-sectional views for showing a manufacturing process of the infrared detector 31. This modified embodiment is characterized by that a shoulder surface of a ceramic container 34 which is defined at an opening of a cavity 33 and on which a container-side metallization layer 36 is formed and a surface which is defined in an outer vicinity of the shoulder surface and on which a supplementary metallization layer 38 is formed are provided at different heights and parallel to each other. Specifically, the shoulder surface on which the container-side metallization layer 36 resides at a higher position than the surface on which the supplementary metallization layer 38 is formed. The difference in height between the two surfaces may preferably be greater than 0.1 mm and less than 5 mm, and is 0.5 mm in this modified embodiment. In the case that a ceramic container 34 has a rectangular shape, the supplementary metallization layer 38 may be formed in each of the four corners of the ceramic container 34, as in the above embodiments. As shown in a cross-sectional view of FIG. 10(a), a window-side metallization layer 37 is formed along a periphery of an underside of an infrared-transmissive window member 35. The window-side metallization layer 37 has a constant width. The container-side metallization layer 36 has an outer diameter smaller than that of the window-side metallization layer 37 at portions adjoining the supplementary metallization layer 38 but has the same outer diameter as the window-side metallization layer 37 at the other portions. The shoulder surface on which the container-side metallization layer 36 is formed has the same outer diameter as the container-side metallization layer 36 at the portions adjoining the supplementary metallization layer 38. The supplementary metallization layer 38 is arranged so as to contact a side surface defined at a step between the shoulder surface surrounding the opening of the cavity 33 and the surface on which the supplementary metallization layer 38 is formed. Thus, when the infrared-transmissive window member 35 is bonded to the container 34, the window-side metallization layer 37 and the supplementary metallization layer 38 overlap each other.

In the manufacturing process, as shown in FIG. 10(a), a melted solder metal 39 is preliminarily arranged on the supplementary metallization layer 38 in such a manner that the solder metal 39 has a greater height than the container-side metallization layer 36 (solder metal preliminary arrangement step). Subsequently, as shown in FIG. 10(b), the solder metal 39 is heated in the vacuum atmosphere, and the infrared-transmissive window member 35 is brought into contact with the solder metal 39, whereby the melted solder metal 39 is guided by the window-side metallization layer 37 to move to the container-side metallization layer 36 (solder metal traveling step). Thereafter, as shown in FIG. 10(c), the infrared-transmissive window member 35 is pressed down to a predetermined height, and this causes the solder metal 39 to enter between the container-side metallization layer 36 and the window-side metallization layer 37 and surround the entire periphery of the opening of the cavity 33.

By forming the container-side metallization layer 36 and the supplementary metallization layer 38 on respective surfaces having different heights and parallel to each other, the solder metal 39 can be effectively prevented from inadvertently being deposited on the container-side metallization layer 36 in the preliminary solder metal arrangement step.

In the above description, the present invention was explained in terms of concrete embodiments, but the present invention may not be limited to these concrete embodiments. For example, in the above embodiments, a ceramic container formed with a cylindrical cavity was used as a first container member, but the cavity may be of a rectangular shape when seen in the plan view. The first container member may even be of a flat plate shape without a cavity so long as the first container member can define an inner space for accommodating the infrared detecting element therein in cooperation with a second container member. Further, though the first container member was made of ceramic in the above embodiments, other materials, such as glass or stainless steel or other metals, which have a low affinity for the solder metal, may also be used. Further, though an infrared-transmissive window member consisting of a planar plate member was used as the second container member, an infrared-transmissive window assembly constituted by a plurality of parts including the infrared-transmissive window member may also be used. The infrared detector may comprise a Peltier device, getter, radiation shield, etc., and the above advantages of the present invention can still be obtained.

The disclosure of the original Japanese patent application (Japanese Patent Application No. 2007-147689 filed on Jun. 4, 2007) on which the Paris Convention priority claim is made for the present application is hereby incorporated by reference in its entirety.

The invention claimed is:

1. An infrared detector, comprising:
   first and second container members bonded to each other along an annular bonding portion to define a vacuum-sealed inner space, the second container member having an infrared-transmissive property;
   an infrared detecting element disposed in the inner space;
   a first annular metallization layer formed on the bonding portion of the first container member;
   a second annular metallization layer formed on the bonding portion of the second container member;
   a third metallization layer formed in a vicinity of one of the first and second metallization layers such that only a part of the third metallization layer overlaps only a part of second metallization layer; and
   a solder metal placed on the third metallization layer extending from the third metallization layer so as to connect the first and second metallization layers to each other, and thereby forming an air-tight bond between the first metallization layer and the second metallization layer.

2. The infrared detector according to claim 1, wherein said third metallization layer comprises a plurality of discrete sections.

3. The infrared detector according to claim 2, wherein the discrete sections of the third metallization layer are arranged around the first metallization layer, and an outer edge of the first metallization layer near first of the discrete sections of the third metallization layer is formed with a recess that recedes inwardly with respect to the discrete sections while the corresponding section of the third metallization layer protrudes into the recess.

4. The infrared detector according to claim 2, wherein the discrete sections of the third metallization layer are arranged so as to partially overlap a circle circumscribed by an opposing edge of the first metallization layer.

5. The infrared detector according to claim 1, wherein the third metallization layer and the one of the first and second metallization layers are formed on parallel surfaces having different heights.

6. The infrared detector according to claim 1, wherein the first, second, and third metallization layers each comprise an electroplating layer having a high affinity index for the solder metal material.

7. The infrared detector according to claim 6, wherein the electroplating layer comprises Ni, Ag, Au, Cr, and Cu.

* * * * *